United States Patent
Bueti et al.

(10) Patent No.: US 7,511,548 B2
(45) Date of Patent: Mar. 31, 2009

(54) CLOCK DISTRIBUTION NETWORK, STRUCTURE, AND METHOD FOR PROVIDING BALANCED LOADING IN INTEGRATED CIRCUIT CLOCK TREES

(75) Inventors: Serafino Bueti, Waterbury, VT (US); Hayden C. Cranford, Jr., Cary, NC (US); Joseph A. Iadanza, Hinesburg, VT (US); Pradeep Thiagarajan, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 11/610,963

(22) Filed: Dec. 14, 2006

(65) Prior Publication Data

US 2008/0148204 A1    Jun. 19, 2008

(51) Int. Cl.
    *G06F 1/04* (2006.01)
(52) U.S. Cl. ........................................ 327/295; 327/291

(58) Field of Classification Search ....................... None
    See application file for complete search history.

(56) References Cited

U.S. PATENT DOCUMENTS

| | | | | |
|---|---|---|---|---|
| 4,812,684 A | * | 3/1989 | Yamagiwa et al. | 327/297 |
| 5,691,662 A | * | 11/1997 | Soboleski et al. | 327/292 |
| 6,701,507 B1 | * | 3/2004 | Srinivasan | 716/10 |
| 2004/0257139 A1 | * | 12/2004 | Shelor | 327/295 |

* cited by examiner

*Primary Examiner*—Cassandra Cox
(74) *Attorney, Agent, or Firm*—Downs Rachlin Martin PLLC

(57) ABSTRACT

A clock distribution network, structure, and method for providing balanced loading is disclosed. In particular, a clock distribution network may be formed of one or more clock fanout distribution levels. Each respective distribution level may include an equal number of buffer circuits and wiring routes that have substantially identical physical and electrical properties. Additionally, a final distribution level may include wiring routes that have substantially identical physical and electrical properties connecting buffer circuits to one or more logic leaf connection nodes.

18 Claims, 4 Drawing Sheets

US 7,511,548 B2

CLOCK DISTRIBUTION NETWORK, STRUCTURE, AND METHOD FOR PROVIDING BALANCED LOADING IN INTEGRATED CIRCUIT CLOCK TREES

RELATED APPLICATION DATA

This application is related to U.S. patent application Ser. No. 11/610,848, filed Dec. 14, 2006, entitled "Clock Distribution Network, Structure, and Method For Providing Balanced Loading In Integrated Circuit Trees," which is incorporated herein by reference in its entirety.

FIELD OF THE DISCLOSURE

The present disclosure generally relates to the field of clock distribution networks in integrated circuits. In particular, the present disclosure is directed to a clock distribution network, structure, and method for providing balanced loading in integrated circuit clock trees.

BACKGROUND

In integrated circuit (IC) design, one of the biggest challenges in the design of high speed, high density application-specific integrated circuits (ASICs) is the implementation of clock distribution networks (i.e., clock trees) for the delivery of synchronization signals to the many logic elements (e.g., latches) on the die with minimum skew and with minimum power consumption. Traditionally, a clock tree has been implemented through a series of synthesis and physical design steps that focus on force fitting a clock distribution network to a particular logic design and then redesigning to compensate for lack of balance of capacitive and resistive loads across the distribution tree. While this has worked well in past generations of ASIC offerings, ever increasing clock speeds and latch counts, in combination with (1) larger die with the associated increase in resistive and capacitive loading, and (2) increasing sensitivity to cross chip variation in transistor parameters because of aggressive scaling of transistor dimensions, has stressed the traditional clock tree methodology.

A need exists for a clock distribution network, structure, and method that more inherently provides balanced loading in integrated circuit clock trees.

SUMMARY OF THE DISCLOSURE

In one embodiment, a method of integrating a clock distribution network and a logic design in an integrated circuit, the clock distribution network having a number of distribution levels from a clock source and a plurality of logic leaf connection nodes, each distribution level including at least one distribution segment is provided. The method includes providing a logic design having a plurality of clocked logic elements; determining a desired load value for each of the plurality of logic leaf connection nodes; grouping one or more of the plurality of clocked logic elements together in a corresponding respective one of a plurality of register structures, each of the plurality of clocked logic elements being grouped in one of the plurality of register structures, each of the plurality of register structures having a load on the clock distribution network that is substantially the same as the desired load value; and assigning each of the plurality of register structures to a corresponding respective one of the plurality of logic leaf connection nodes.

In another embodiment, a method of integrating a clock distribution network and a logic design in an integrated circuit, the clock distribution network having a number of distribution levels from a clock source and a plurality of logic leaf connection nodes, each distribution level including at least one distribution segment is provided. The method includes providing a logic design having a plurality of clocked logic elements; determining a desired load value for each of the plurality of logic leaf connection nodes; grouping one or more of the plurality of clocked logic elements together in a corresponding respective one of a plurality of register structures, each of the plurality of clocked logic elements being grouped in one of the plurality of register structures, each of the plurality of register structures having a load on the clock distribution network that is substantially the same as the desired load value; connecting each of the plurality of register structures to a corresponding respective one of the plurality of logic leaf connection nodes; connecting a dummy register to a corresponding respective one of the plurality of logic leaf connection nodes that is not connected to one of the plurality of registers, the dummy register having a load on the clock distribution network that is substantially the same as the desired load value; connecting a tuning element to a corresponding respective one of the plurality of logic leaf connection nodes that is not connected to one of the plurality of register structures; and ensuring that all of the plurality of logic leaf connection nodes have a load that is substantially the same as the desired load value.

In yet another embodiment, a computer readable medium containing computer executable instruction implementing a method of integrating a clock distribution network and a logic design in an integrated circuit, the clock distribution network having a number of distribution levels from a clock source and a plurality of logic leaf connection nodes, each distribution level including at least one distribution segment is provided. The instructions include a set of instructions for receiving a logic design having a plurality of clocked logic elements; a set of instructions for determining a desired load value for each of the plurality of logic leaf connection nodes; a set of instructions for grouping one or more of the plurality of clocked logic elements together in a corresponding respective one of a plurality of register structures, each of the plurality of clocked logic elements being grouped in one of the plurality of register structures, each of the plurality of register structures having a load on the clock distribution network that is substantially the same as the desired load value; and a set of instructions for connecting each of the plurality of register structures to a corresponding respective one of the plurality of logic leaf connection nodes.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
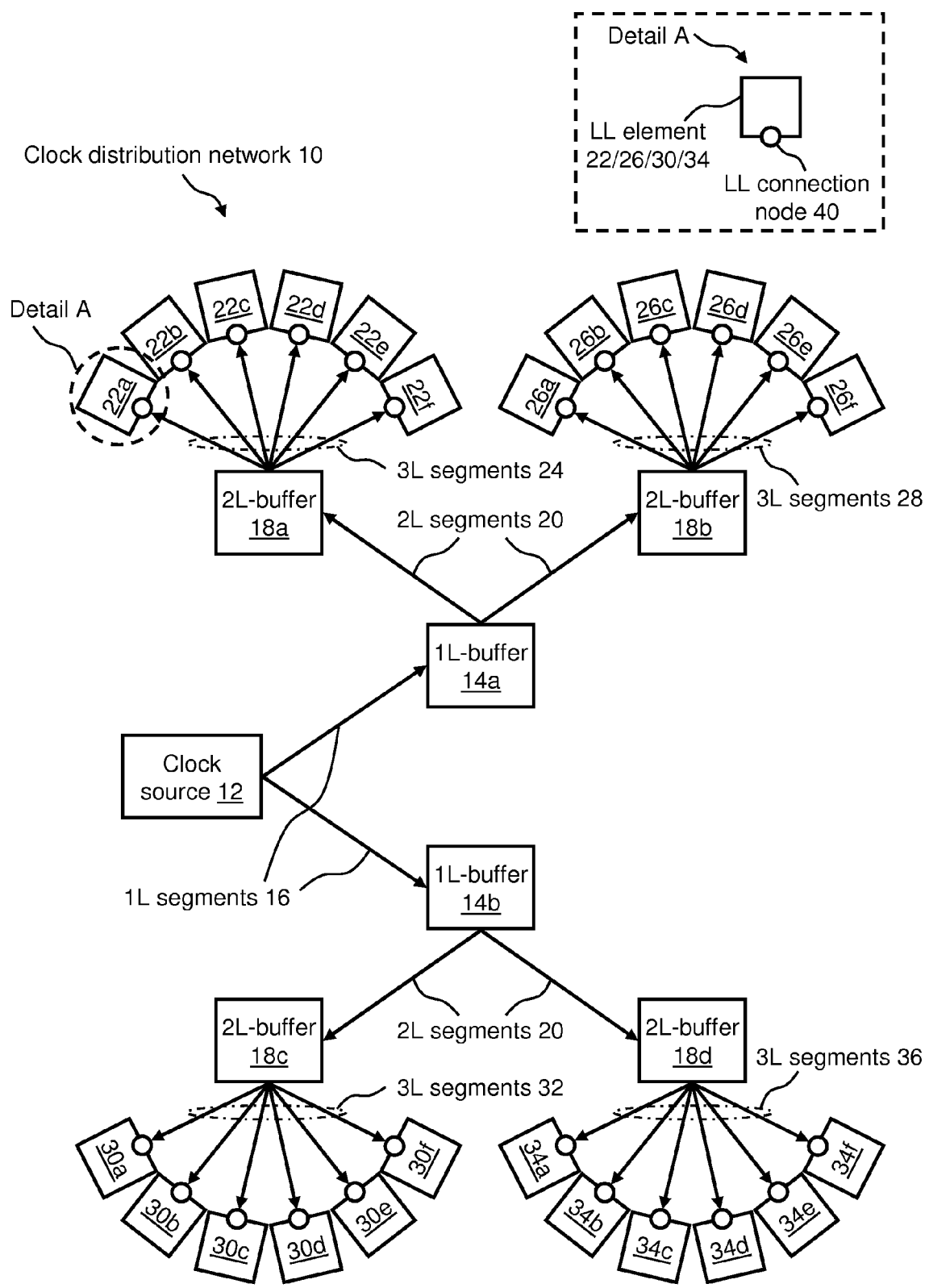
FIG. 1 illustrates a high level block diagram of an example of a clock distribution network that inherently provides balanced loading.

FIG. 1 illustrates a high level block diagram of one embodiment of a clock distribution network 10, which is an example of a clock distribution network that inherently provides balanced loading. One or more instances of a clock distribution network, such as clock distribution network 10, may be implemented within a single IC chip (not shown). In particular, a clock distribution network and structure, such as clock distribution network 10, may be formed of any number of one or more clock fanout distribution levels and a logic leaf distribution level. Each respective distribution level may include one or more buffer circuits, wherein each buffer circuit drives the same number of substantially equal loads. In one example, each buffer circuit of a certain distribution level may drive four wiring routes to four loads, respectively. Additionally, all wiring routes within a particular distribution level have substantially identical physical and electrical properties. In another example, a logic leaf distribution level, which is a final or Nth distribution level, may include a plurality of distribution segments. Each of distribution segments in a logic leaf distribution level connect a buffer circuit from the previous distribution level to one or more logic element. The distribution segments (i.e., wiring routes) connect the same number of logic elements to each of the buffer circuits of the previous level. In one example, each buffer circuit of the logic leaf distribution level may drive six wiring routes to six loads, respectively. Additionally, all wiring routes of the logic leaf distribution level have substantially identical physical and electrical properties. In one aspect, substantially identical physical and electrical properties, loading, and load distribution is maintained from one buffer circuit to another across each clock fanout distribution level and across the logic leaf distribution level of the clock distribution network in order to form a structurally balanced homogeneous topology. In doing so, the arrival time and skew of multiple clock signals at the output of the final or Nth distribution level of the clock distribution network may be substantially identical. More details of an example of such a clock distribution network are provided with reference to clock distribution network 10 of FIG. 1 below.

Clock distribution network 10 may include a clock source 12, which may be any clock generator device that is internal or external to an IC chip. In one example, clock source 12 may be a phase-locked loop (PLL) circuit. In another example, clock source 12 may be a crystal oscillator. Clock source 12 may be the root of one or more clock distribution networks that are implemented within a single IC chip. A certain balanced routing is provided from clock source 12 to a first set of any number of clock tree buffer circuits. Wiring from clock source 12 to each of the first set of buffer circuits is made by use of substantially identical wiring routes of equal lengths. All wiring routes that are driven by clock source 12 have substantially identical physical and electrical properties, such as substantially identical metal and via construction and overlay and underlay density. In one example, the wiring routes may be isolated either vertically, horizontally, or both from other wiring routes on the IC chip. In one example of a first distribution level of clock fanout and referring to FIG. 1, a balanced routing is provided from clock source 12 to a set of any number of first-level buffer circuits (1L-buffers) 14, e.g., 1L-buffers 14a and 14b. Wiring from an output node of clock source 12 to an input node of each of 1L-buffers 14a and 14b is made with substantially identical wiring routes of equal lengths. In particular, all wiring routes between clock source 12 and 1L-buffers 14a and 14b have substantially identical physical and electrical properties, such as substantially identical metal and via construction and overlay and underlay density. In one example, the physical and electrical properties being the same in each of the distribution segments in a given distribution level may provide the same load characteristics to each path between a clock source and any driven logic elements connected at the end of the path or along the path. As shown in the exemplary embodiment of FIG. 1, a plurality of first-level (1L) segments 16 may be the substantially identical wiring routes between clock source 12 and 1L-buffers 14a and 14b.

Each buffer in the first set of buffer circuits, such as 1L-buffers 14a and 14b, is connected to a second set of any number of clock tree buffer circuits, again by use of balanced routing structures of substantially identical length and construction. Each buffer in the first set of buffer circuits, such as 1L-buffers 14a and 14b, is wired to the same number of routing wires and loads. Referring to FIG. 1, in one example of a second distribution level of clock fanout, a certain balanced routing is provided from each 1L-buffer 14 to a set of any number of second-level buffer circuits (2L-buffers) 18, e.g., 1L-buffer 14a may be routed to 2L-buffers 18a and 18b and 1L-buffer 14b may be routed to 2L-buffers 18c and 18d. All wiring routes between each 1L-buffers 14a and 14b and 2L-buffers 18a, 18b, 18c, and 18d have substantially identical physical and electrical properties, such as substantially identical length, metal and via construction, and overlay and underlay density. In one example of second-level distribution segments, a plurality of second-level (2L) segments 20 may be the substantially identical wiring routes between 1L-buffer 14a and its 2L-buffers 18a and 18b and 1L-buffer 14b and its 2L-buffers 18c and 18d. In another example, distribution segments in the same distribution level may have the same physical and electrical properties as each other, but differ from the physical and electrical properties of distribution segments in a different distribution level.

Although only two levels of buffering are described above and shown in FIG. 1, any number of levels of buffering may be provided in like manner, i.e., each level with wiring routes of substantially identical physical and electrical properties, substantially identical loading, and substantially identical load distribution. The Nth level of buffering may be the "leaf" end of the clock tree, i.e., a logic leaf distribution level. Each leaf clock buffer, such as 2L-buffers 18a, 18b, 18c, and 18d in the example of FIG. 1, drives an identical load. The load may be formed of a wire component of known construction. The circuit load may be formed of, for example, one or more active loads, one or more dummy registers, one or more tuning elements, or any combination thereof. Details of example loads are found with reference to FIGS. 2 through 8. In another example, not shown, logic leaf elements may be connected along the clock distribution network path so long as each path includes a logic element or dummy element having the same load as the others in substantially the same physical location in the network.

In one example of the Nth level of buffering and referring to FIG. 1, 3L distribution segments 24, 28, 32, and 36 connect the 2L-buffers 18a, 18b, 18c, and 18d of the previous distribution level, respectively to any number of logic leaf elements (i.e., loads). In this example, 2L-buffers 18a, 18b, 18c, and 18d each drive the same number of loads, respectively. More specifically, 2L-buffer 18a may be driving a set of multiple logic leaf (LL) elements 22, such as LL elements 22a through 22f; 2L-buffer 18b may be driving a set of multiple LL elements 26, such as LL elements 26a through 26f; 2L-buffer 18c may be driving a set of multiple LL elements 30, such as LL elements 30a through 30f; and 2L-buffer 18d may be driving a set of multiple LL elements 34, such as LL elements 34a through 34f. Detail A of FIG. 1 shows that each instance of LL elements 22, 26, 30, and 36 includes a logic leaf (LL) connection node 40 into which 2L-buffers 18a, 18b, 18c, and 18d are connected via respective 3L segments 24, 28, 32, and 36. Each buffer circuit of the logic leaf distribution level, which may be the Nth level of buffering, is connected to an equal number of LL connection nodes. In the example shown in FIG. 1, each of 2L-buffers 18a, 18b, 18c, and 18d drive an equal number of LL elements 22, 26, 30, and 36 respectively, and thus drive an equal number of LL connection nodes 40.

Each logic leaf element may be, for example, any clocked logic element, such as, but not limited to, an element that is formed using a one-bit or multi-bit register structure. Examples of logic leaf elements are described with reference to FIGS. 2 through 8. In one example, a logic leaf element may be a dummy register that has the same loading characteristics as the other logic leaf elements in a distribution network.

The total load driven by each of 2L-buffers 18a, 18b, 18c, and 18d, respectively, are substantially equal to one another. Additionally, the distribution of the loads driven by each of 2L-buffers 18a, 18b, 18c, and 18d, respectively, are substantially equal to one another. Additionally, each load, such as each of LL elements 22, 26, 30, or 36, are substantially equal to one another. In one example, as shown in FIG. 1, the wiring from an output node of each 2L-buffer 18 to LL connection node 40 of each of LL elements 22, 26, 30, or 36 is made with substantially identical wiring routes of equal lengths. In particular, all wiring routes between 2L-buffer 18a, 18b, 18c, and 18d and LL elements 22, 26, 30, or 36, respectively, have substantially identical physical and electrical properties, such as substantially identical length, metal and via construction, and overlay and underlay density. In one example of third-level distribution segments, a plurality of third-level (3L) segments 24, 28, 32, and 36 may each have the same physical and electrical properties between 2L-buffer 18a, 18b, 18c, and 18d and LL elements 22, 26, 30, or 36, respectively. In an alternative embodiment, one or more of the distribution segments connecting each of buffer circuits 18a, 18b, 18c, and 18d may include connection to a plurality of logic leaf connection nodes (e.g., logic leaf connection node 40). In this embodiment, the distance to each logic leaf connection node may vary, but is known, controlled, and can be modeled. Additionally, in such an example, each of buffer circuits 18a, 18b, 18c, and 18d would have the same multi-node logic leaf distribution segment such that each of the buffer circuits 18a, 18b, 18c, and 18d would drive the same load.

A clock distribution network, such as a clock distribution network 10, provides the skeleton for the placement of logic leaf elements (i.e., loads), such as LL elements 22, 26, 30, or 36, into an IC chip. Details of example logic leaf elements, which may be the substantially equal loads that are driven by each of the leaf clock buffers, such as driven by each of 2L-buffers 18a, 18b, 18c, and 18d, are described with reference to FIGS. 2 through 8. In particular and by way of example, FIGS. 2 through 8 provide a set of example register structures having equal loading characteristics.

Figure 2:
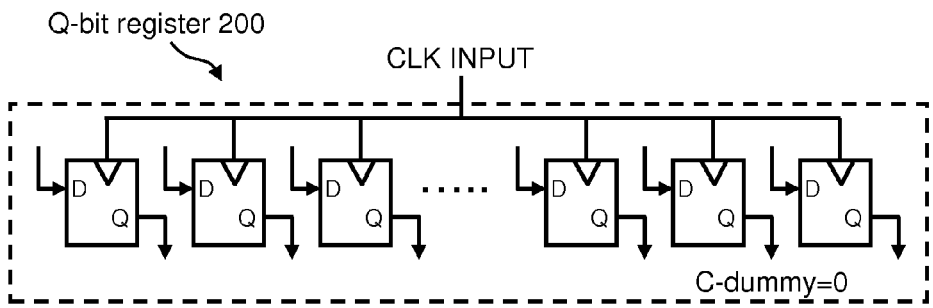
FIG. 2 illustrates a Q-bit register, which is an example of a logic leaf element that may be connected to a clock distribution network.

FIG. 2 illustrates a Q-bit register 200, which is an example of a logic leaf element that may be connected to a clock distribution network, such as clock distribution network 10 of FIG. 1. Q-bit register 200 implements a register structure of multiple latches in order to form Q bits of storage that use a common clock. Q-bit register 200 may be designed to provide connection at selected points on the routing wire. In addition, Q-bit register 200 may be designed to minimize the impacts of across chip parametric variations across the register bits by use of any number of techniques, such as dummy devices in the layout (see FIGS. 4 and 5), inter-digitation of devices, or use of differential architectures.

Figure 3:
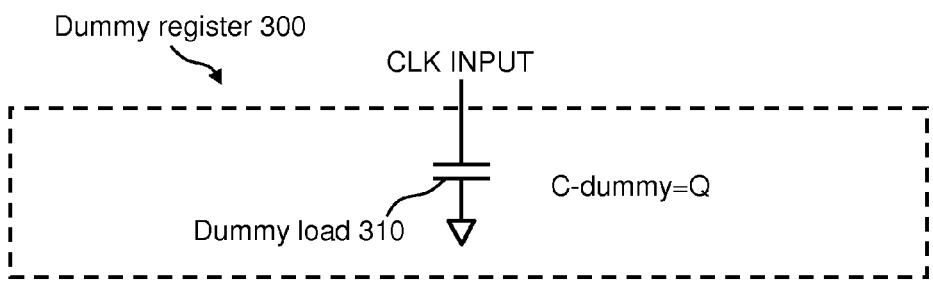
FIG. 3 illustrates a register connect dummy load, which is an example of a dummy register for mimicking a logic leaf element that may be connected to a clock distribution network.

FIG. 3 illustrates a dummy register 300, which is an example of a dummy register for mimicking a logic leaf element that may be connected to a clock distribution network, such as clock distribution network 10 of FIG. 1. Dummy register 300 simulates the load of Q-bit register 200 that is attached to a leaf clock line and may be constructed of a disabled register (no data input or output) that has intact clock inputs or by another capacitive architecture. In one example, dummy register 300 includes one or more dummy load elements 310 (e.g., a capacitor).

Figure 4:
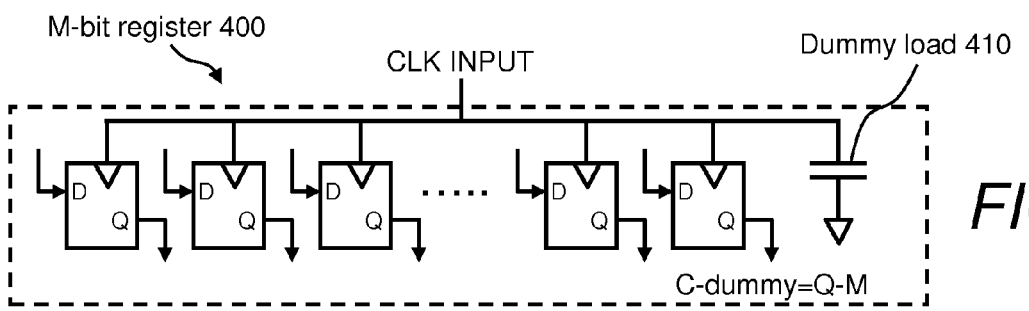
FIG. 4 illustrates an M-bit register, which is another example of a logic leaf element that may be connected to a clock distribution network.

FIG. 4 illustrates an M-bit register 400, which is another example of a logic leaf element that may be connected to a clock distribution network, such as clock distribution network 10 of FIG. 1. M-bit register 400 provides a register structure that has fewer bits of storage (e.g., fewer latches) than Q-bit register 200 while still providing a clock capacitance that is equivalent to the clock capacitance of Q-bit register 200 or dummy register 300. In one example, M-bit register 400 may be constructed by disabling the data paths of Q minus M register bits of Q-bit register 200, while leaving the clock loading intact. In another example, M-bit register 400 may include circuitry representing M bits and one or more dummy load elements 410, such that the total load of M-bit register 400 is the same as the load of other logic leaf elements in the clock distribution network. In yet another example, the clock loading of an M-bit register 400 is the same as that of Q-bit register 200 by the combination of M register bits and a capacitive load that is equal to Q register bits minus M register bits.

Figure 5:
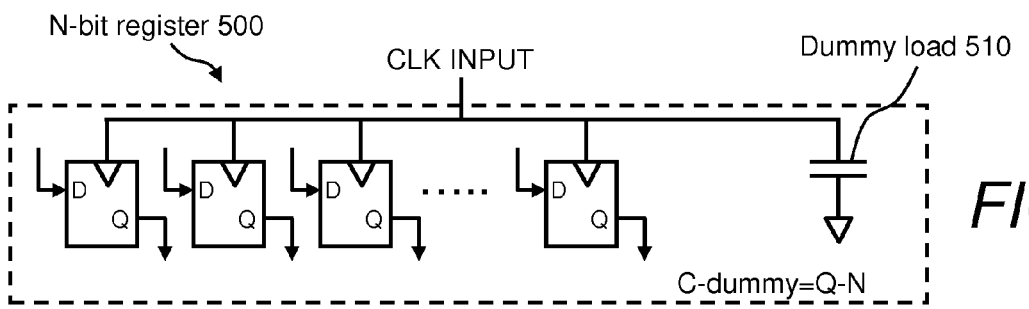
FIG. 5 illustrates an N-bit register, which is yet another example of a logic leaf element that may be connected to a clock distribution network.

FIG. 5 illustrates an N-bit register 500, which is yet another example of a logic leaf element that may be connected to a clock distribution network, such as clock distribution network 10 of FIG. 1. N-bit register 500 provides a register structure that has fewer bits of storage (e.g., fewer latches) than Q-bit register 200 and M-bit register 400 while still providing a clock capacitance that is equivalent to the clock capacitance of Q-bit register 200 or dummy register 300. N-bit register 500 may be constructed by disabling the data paths of Q minus N register bits of Q-bit register 200, while leaving the clock loading intact. In another example, N-bit register 500 may include circuitry representing N bits and one or more dummy load elements 510, such that the total load of N-bit register 500 is the same as the load of other logic leaf elements in the clock distribution network. In yet another example, the clock loading of an N-bit register 500 is substantially equal to that of Q-bit register 200 by the combination of N register bits and a capacitive load that is substantially equal to Q register bits minus N register bits.

Figure 6:
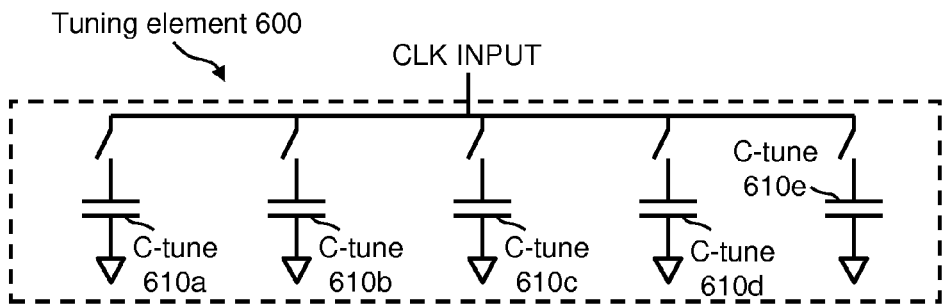
FIG. 6 illustrates a tuning element, which is yet another example of a logic leaf element that may be connected to a clock distribution network.

FIG. 6 illustrates a tuning element 600, which is yet another example of a logic leaf element that may be connected to a clock distribution network, such as clock distribution network 10 of FIG. 1. Tuning element 600 is formed of an array of capacitors, such as tuning capacitors (C-tunes) 610, which may be selectively connected or disconnected in order to tune the capacitance on the wiring routes. In another example, tuning element 600 may include one or more varactors for controlling capacitance. In one example of a use of a varactor, a switch may not be necessary. The selection mechanism of tuning element 600 may be, for example, but is not limited to, fuse technology, eFuse technology, anti-fuse technology, or any combinations thereof. The selection of the capacitance of tuning element 600 via the selection C-tunes 610 (e.g., C-tune 610a, 610b, 601c, 610d, and 610e) may be programmable. For example, tuning element 600 may be mask programmable, electrically programmable at final chip test, or electrically programmable throughout the IC operational lifetime. In one example, a tuning element (e.g., tuning element 600) may be connected to a logic leaf connection node, the tuning element having the same load as each of the other logic leaf elements connected in the distribution network. In another example, a tuning element (e.g., tuning element 600) may be connected to a logic leaf connection node of each of the last stage buffer circuits (e.g., buffer circuits 18a, 18b, 18c, and 18d of FIG. 1) and not have the same load as each of the other logic leaf elements connected in the distribution network. In such an example, the impact of the differing load characteristics would impact each of the logic leaf distribution networks of the last stage buffer circuits equally.

Figure 7:
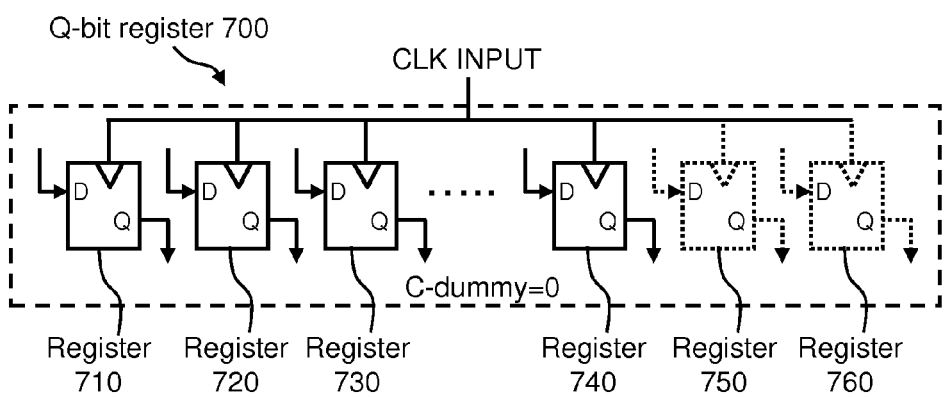
FIG. 7 illustrates another Q-bit register, which is yet another example of a logic leaf element that may be connected to a clock distribution network.

FIG. 7 illustrates a Q-bit register 700, which is yet another example of a logic leaf element that may be connected to a clock distribution network, such as clock distribution network 10 of FIG. 1. Q-bit register 700 implements a register structure of multiple latches in order to form Q bits of storage that use a common clock. In one example, Q-bit register 700 includes latches 710 720, 730, 740, 750, 760. Q-bit register 700 may be designed to provide connection at selected points on the routing wire. Q-bit register 700 may be substantially identical to Q-bit register 200 of FIG. 2 except that Q-bit register 700 includes register bits that are defined as "reserved" (e.g., latches 750 and 760). In one example, reserved bits may be extraneous bits to a particular logic design integrated with the clock distribution network. A reserve bit may be used after initial integration (e.g., in late design phase, after physical manufacturing of the integrated circuit, for implementation of logic changes which require additional sequential elements) in order to ensure that modifications to the logic design can be implemented even after a clock tree network is fully populated. In one example, a reserve bit may be utilized to modify logic design (which may otherwise require difficult redesign of the logic design and/or clock network) without disturbing the balanced clock distribution network. The number of the reserved bits may vary based on, for example, but not limited to, the type of applications or logic maturity level. In one example, Q-bit register 700 of FIG. 7 includes two register bits (latches 750 and 760) that are defined as reserved. Other register configurations may similarly include reserved register bits. For example, M-bit register 400 of FIG. 4 and N-bit register 500 of FIG. 5 may each include one or more reserved register bits. In another example, the number of reserved bits may vary amongst Q-bit, M-bit, and/or N-bit registers in a particular design.

Figure 8:
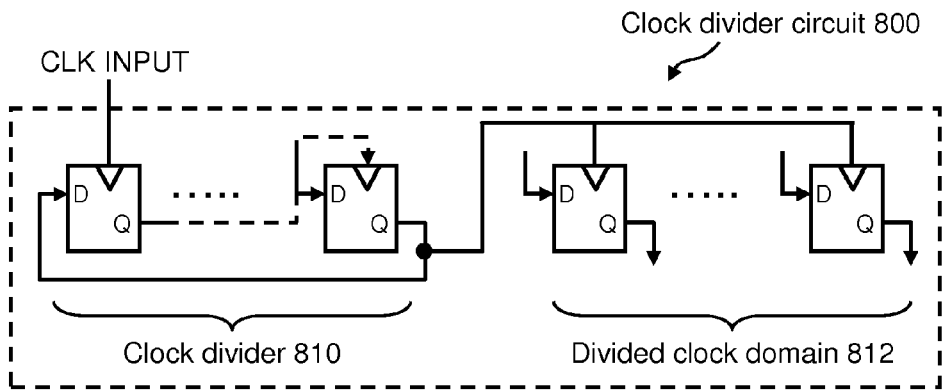
FIG. 8 illustrates a clock divider circuit, which is yet another example of a logic leaf element that may be connected to a clock distribution network.

FIG. 8 illustrates a clock divider circuit 800, which is yet another example of a logic leaf element that may be connected to a clock distribution network, such as clock distribution network 10 of FIG. 1. While the clock tree structure that is described with reference to clock distribution network 10 of FIG. 1 may be applied to single or multiple clock trees, an alternative embodiment of the register structure, such as those shown in FIGS. 2 through 7, allows for reduction of the number of clocks propagated in systems by providing a division of a clock source, such as provided by clock source 12. Clock divider circuit 800 of FIG. 8 is one example of this alternative register structure that provides a division of a clock.

Referring again to FIG. 8, a clock-divided register, such as clock divider circuit 800, may be connected to the leaf clock line. In one example, clock divider circuit 800 may include two groups of sequential elements (e.g., latches) and a load capacitor (not shown) for the clock input in order to emulate the load of a Q bit register, such as Q-bit register 200 of FIG. 2. The size of the clock divider may be determined by the number of latches chosen to achieve a desired divide value. A first group of sequential elements is used to implement a divider circuit, e.g., a clock divider 810, which divides the incoming clock by a known factor. Clock divider 810 may be implemented in any number of known architectures including, but not limited to, an LFSR structure and a ripple structure. Within clock divider circuit 800, a set of sequential elements, such as latches, is provided within a divided clock domain 812. All latches within divided clock domain 812 are fed by the divided clock generated within clock divider 810 of clock divider circuit 800. The divided clock is therefore local to clock divider circuit 800. In one example, the sequential elements of divided clock domain 812 may not load the clock input to clock divider circuit 800. In such an example, it may be necessary to add one or more dummy load elements to clock divider circuit 800 to ensure that the load on the logic leaf connect node to which clock divider circuit 800 is connected remains the same as other logic leaf elements in the clock distribution network.

Q-bit register 200 of FIG. 2, dummy register 300 of FIG. 3, M-bit register 400 of FIG. 4, N-bit register 500 of FIG. 5, tuning element 600 of FIG. 6, Q-bit register 700 of FIG. 7, and clock divider circuit 800 of FIG. 8, may be one example of a set of loads of a certain desired load value that are substantially equal one to another. As discussed above, in some examples, a tuning element (e.g., tuning element 600 of FIG. 6) may have a different load characteristic as long as the tuning element is properly placed in a balanced manner within the last stage of distribution. Q-bit register 200, dummy register 300, M-bit register 400, N-bit register 500, and tuning element 600 may be, for example, available to an integrated circuit designer within a library of components during the design phase of a clock distribution network, such as clock distribution network 10 of FIG. 1.

Referring again to FIGS. 1 through 8, a clock distribution network, such as clock distribution network 10 of FIG. 1, may be formed of any combination of substantially equal logic leaf element (i.e., loads), such as any combination of one or more Q-bit registers 200, dummy registers 300, M-bit registers 400, N-bit registers 500, tuning element 600, Q-bit register 700, and clock divider circuit 800. In particular, Q-bit registers 200, dummy registers 300, M-bit registers 400, N-bit registers 500, tuning element 600, Q-bit register 700, and clock divider circuit 800 may be one example collection of logic leaf element (i.e., loads) that have predetermined substantially equal loading characteristics. By way of example, Tables 1, 2, and 3 below provide example ways in which the loads of the Nth level of buffering within a clock distribution network, such as clock distribution network 10 of FIG. 1, are assigned in a balanced manner. In particular, in the examples of Tables 1, 2, and 3 each group of LL elements 22, 26, 30, and 34 may include, for example, but not limited to, at least one tuning element 600 along with any combination of Q-bit registers 200, dummy registers 300, M-bit registers 400, N-bit registers 500, Q-bit register 700, and/or clock divider circuit 800. In one example, selection of the specific load that is associated with each logic leaf element, the number of bits in a register, the physical placement of the logic leaf elements, and/or tuning load requirements may be determined from an analysis of a logic design to be integrated with and clocked by the clock distribution network.

TABLE 1

First example set of loads of the Nth level of buffering

| LL element | Load | LL element | Load |
| --- | --- | --- | --- |
| First Leaf | | Second Leaf | |
| LL element 22a | Dummy register 300 | LL element 26a | Dummy register 300 |
| LL element 22b | Dummy register 300 | LL element 26b | Dummy register 300 |
| LL element 22c | Dummy register 300 | LL element 26c | Dummy register 300 |
| LL element 22d | Tuning element 600 | LL element 26d | Tuning element 600 |
| LL element 22e | Dummy register 300 | LL element 26e | Dummy register 300 |
| LL element 22f | Dummy register 300 | LL element 26f | Dummy register 300 |
| Third Leaf | | Fourth Leaf | |
| LL element 30a | Dummy register 300 | LL element 34a | Dummy register 300 |
| LL element 30b | Dummy register 300 | LL element 34b | Dummy register 300 |
| LL element 30c | Dummy register 300 | LL element 34c | Dummy register 300 |
| LL element 30d | Tuning element 600 | LL element 34d | Tuning element 600 |
| LL element 30e | Dummy register 300 | LL element 34e | Dummy register 300 |
| LL element 30f | Dummy register 300 | LL element 34f | Dummy register 300 |

TABLE 2

Second example set of loads of the Nth level of buffering

| LL element | Load | LL element | Load |
| --- | --- | --- | --- |
| First Leaf | | Second Leaf | |
| LL element 22a | Q-bit register 200 | LL element 26a | Dummy register 300 |
| LL element 22b | Dummy register 300 | LL element 26b | N-bit register 500 |
| LL element 22c | N-bit register 500 | LL element 26c | Q-bit register 700 |
| LL element 22d | Tuning element 600 | LL element 26d | Tuning element 600 |
| LL element 22e | Q-bit register 200 | LL element 26e | Dummy register 300 |
| LL element 22f | M-bit register 400 | LL element 26f | Q-bit register 200 |
| Third Leaf | | Fourth Leaf | |
| LL element 30a | Q-bit register 200 | LL element 34a | Q-bit register 200 |
| LL element 30b | Q-bit register 700 | LL element 34b | M-bit register 400 |
| LL element 30c | N-bit register 500 | LL element 34c | N-bit register 500 |
| LL element 30d | Tuning element 600 | LL element 34d | Tuning element 600 |
| LL element 30e | M-bit register 400 | LL element 34e | Dummy register 300 |
| LL element 30f | Q-bit register 200 | LL element 34f | Clock divider circuit 800 |

TABLE 3

Third example set of loads of the Nth level of buffering

| LL element | Load | LL element | Load |
| --- | --- | --- | --- |
| First Leaf | | Second Leaf | |
| LL element 22a | Q-bit register 200 | LL element 26a | Q-bit register 200 |
| LL element 22b | Q-bit register 200 | LL element 26b | Q-bit register 200 |
| LL element 22c | Q-bit register 200 | LL element 26c | Q-bit register 200 |
| LL element 22d | Tuning element 600 | LL element 26d | Tuning element 600 |
| LL element 22e | Q-bit register 200 | LL element 26e | Q-bit register 200 |
| LL element 22f | Q-bit register 200 | LL element 26f | Q-bit register 200 |
| Third Leaf | | Fourth Leaf | |
| LL element 30a | Q-bit register 200 | LL element 34a | Q-bit register 200 |
| LL element 30b | Q-bit register 200 | LL element 34b | Q-bit register 200 |
| LL element 30c | Q-bit register 200 | LL element 34c | Q-bit register 200 |
| LL element 30d | Tuning element 600 | LL element 34d | Tuning element 600 |

TABLE 3-continued

Third example set of loads of the Nth level of buffering

| LL element | Load | LL element | Load |
|---|---|---|---|
| LL element 30e | Q-bit register 200 | LL element 34e | Q-bit register 200 |
| LL element 30f | Q-bit register 200 | LL element 34f | Q-bit register 200 |

In one example, substantially identical physical and electrical properties, loading, and load distribution is maintained from one buffer circuit to another across each clock fanout distribution level and across the logic leaf distribution level, such as shown in Tables 1, 2, and 3, of the clock distribution network, such as clock distribution network 10 of FIG. 1, in order to form a structurally balanced homogeneous topology. In one aspect, this includes each distribution segment and/or buffer circuit in a given distribution level having the same load characteristics as other distribution segments and/or buffer circuits in that distribution level. In one example, this may allow the arrival time and skew of multiple clock signals at the output of the final or Nth distribution level of the clock distribution network to be substantially identical.

A clock distribution network, such as clock distribution network 10 of FIG. 1, is not limited to the Nth level loading that is shown in Tables 1, 2, and 3. Tables 1, 2, and 3 are exemplary only. Additionally, a clock distribution network, such as clock distribution network 10 of FIG. 1, is not limited to the substantially equal logic leaf element (i.e., loads) that are described in FIGS. 2 through 8. Q-bit register 200 of FIG. 2, dummy register 300 of FIG. 3, M-bit register 400 of FIG. 4, N-bit register 500 of FIG. 5, tuning element 600 of FIG. 6, Q-bit register 700 of FIG. 7, and clock divider circuit 800 of FIG. 8 are exemplary only. Multiple sets or groups of clocked logic elements, such as groups of latches to form register structures, of any width may be provided as long as the clock capacitance that is associated with any structure that is connected to the clock tree is equivalent. Additionally, the grouping may occur for latches that are closely associated by logic unit, logic cone, or recognized parallelism (data paths) and are assigned as tightly together as possible.

Furthermore, the clock fanout distribution levels of a clock distribution network, such as clock distribution network 10 of FIG. 1, are not limited to clock tree buffer circuits only, such as 1L-buffers 14a and 14b or 2L-buffers 18a, 18b, 18c, and 18d only. Alternatively, the clock fanout distribution levels may include a combination of clock tree buffer circuits and other logic elements, such as logic gates, or macro functions, such as memory arrays, that are commonly found in IC design as long as the loading and wiring routes of each distribution level are maintained substantially identical.

Figure 9:
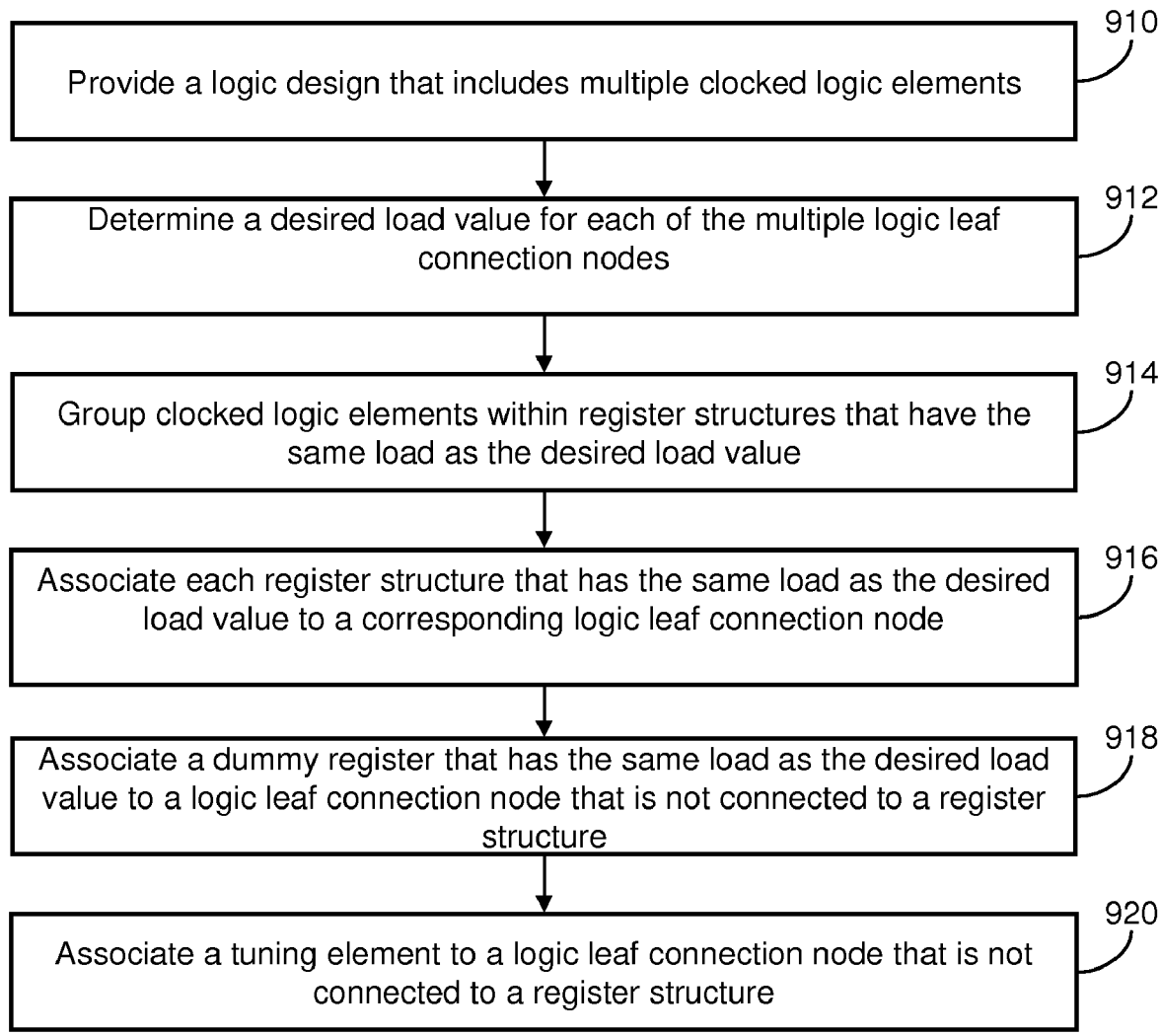
FIG. 9 illustrates a flow diagram of an example of a method of integrating a clock distribution network and a logic design in an integrated circuit.

A clock distribution network, such as clock distribution network 10 of FIG. 1, may be integrated with any logic design. The particular number of circuit elements to be clocked in a given logic design may dictate how a clock distribution network will be constructed. However, an example clock distribution network of the present disclosure will have a physical and electrical structure that inherently balances load across all paths from a clock source to logic leaf elements, as described above. A given logic design may also dictate multiple clock distribution networks to propagate a clock signal from multiple clock sources, respectively. The following description illustrates, with reference to FIG. 9, a method 900 of integrating a clock distribution network and a logic design in an integrated circuit. It will be understood from the disclosure herein that multiple clock distribution networks may be integrated with a logic design.

At step 910, a logic design having multiple logic elements to be clocked is provided. Example logic elements include, but are not limited to, a latch, a register having multiple logic elements, a datapath element, a core functional block, a memory array (e.g., RAM), a dynamic logic element, and any combinations thereof. In one example, where a memory array or a macro function is to be connected to a logic leaf connection node, the clock input for the element may be configured to provide the desired load characteristics of other logic leaf elements connected to the same clock distribution network.

As described above, a clock distribution network (e.g., clock distribution network 10 of FIG. 1) will have a number of logic leaf connection nodes for connection of logic leaf elements. Each logic leaf connection node will have the same electrical load connected thereto. At step 912, a desired load value for each logic leaf connection node is determined. In one example, a desired load value may be determined via an analysis of the circuit requirements of the logic design. A minimum number of logic leaf connection nodes may be determined that will satisfy the total number of logic elements in the design. In another example, extra capacity may be built into the number of logic leaf connection nodes for flexibility in the integration of the logic design and the clock distribution network.

At step 914, the logic elements of the logic design are grouped together in register structures that have the same load characteristics. The load characteristics are set to the desired load value. In one example, the determination of the desired load value and the grouping of the logic elements in register structures may occur together so as to define the minimum load value to accommodate all of the logic elements of the logic design. In another example, the grouping of logic elements may occur after a number of logic leaf connect nodes and a desired load value are determined. In an alternate embodiment, determining the desired load value may be accomplished by determining how many bits will be required in each register structure to accommodate the logic design. The desired load value will be equivalent to the load that would be associated with the circuitry representing the desired number of bits (e.g., the preferred bit width of an ideal register structure). A bit width of a register structure may be determined to allow for variation in the logic leaf elements that can be assigned to a clock distribution network. For example, logic elements may be grouped into logic leaf elements (e.g., registers) such that the logic leaf element includes Q-bits (see FIG. 2 discussed above). In another example, logic elements may be grouped into a register that includes an number of bits less than Q bits. Such a register may also include a dummy load to bring the load of the register to the same value as the Q bit register, which will have the desired load that was determined above. In yet another example, logic elements may be grouped into a logic leaf element such that extraneous bits are included in the register for future use. Other variations of grouping will be evident from the description herein. For example, one or more latches or other logic elements of the logic design, may be grouped together to form Q-bit register, such as Q-bit register 200 of FIG. 2; an M-bit register, such as M-bit register 400 of FIG. 4, an N-bit register, such as N-bit register 500 of FIG. 5; a Q-bit register with reserved bits, such as Q-bit register 700 of FIG. 7; and/or a clock divider circuit, such as clock divider circuit 800 of FIG. 8 that each have the same load as the desired load value of step 912.

As discussed above, the grouping of clocked logic elements, such as latches, may involve auditing the logic design, determining a preferred bit width for the register structures, assigning multiple clocked logic elements to a corresponding respective register structure such that the number of clocked logic elements assigned to each of the register structures is less than or equal to the preferred bit width, and assigning one or more dummy load elements and/or one or more reserve bits to any of the multiple register structures that have less than the desired load such that each of the multiple register structures has the desired load. In another example, the grouping may take into account how closely associated each logic element of a logic design is to another logic element in the design (e.g., logic elements that are in the same logic unit, logic cone, or recognized parallelism (data paths)). Such logic elements may be grouped into the same or physically close logic leaf elements (e.g., registers). The number of dummy elements, the size of each register structure, the usage of tuning elements, and/or the number of reserve bits may be determined taking into account the level of distribution of the logic elements of the logic design into the register structures of the clock distribution network. In one example, where a macro function may truncate a particular branch of a distribution network, the number of reserve bits and dummy registers may be increased to allow for additional flexibility.

The physical size of the target integrated circuit may be taken into account during any of the determination of the desired load value, the number of logic leaf elements, the number of logic elements to group into a logic leaf element, the specific grouping of logic element into a logic leaf element, generation of reserve bits, the depth (e.g., number of distribution levels) to be implemented in the network, architecture of clock divider, and any combinations thereof. Design information (e.g., IC synthesis library elements) for a logic design and a clock distribution network may be stored in one or more databases and accessed during the method.

At step 916, each register structure (i.e., logic leaf element) is assigned to a corresponding logic leaf connection node. In one example, any combination of one or more Q-bit registers 200 of FIG. 2, M-bit registers 400 of FIG. 4, N-bit registers 500 of FIG. 5, Q-bit registers 700 of FIG. 7, and clock divider circuits 800 of FIG. 8 may be connected to LL connection nodes 40 of LL elements 22, 26, 30, and/or 34 of clock distribution network 10 of FIG. 1. Examples of such connections are shown in Tables 1, 2, and 3.

Optionally, at step 918, a dummy register that has the same load as the desired load value of step 912 may be connected to at least one logic leaf connection node that is not connected to a register structure having one or more logic elements grouped therein. In one example, dummy register 300 of FIG. 3, which has the same load as the desired load value of step 912, is connected to at least one of the multiple LL connection nodes 40 of LL elements 22, 26, 30, and/or 34 of clock distribution network 10 of FIG. 1, as shown in Table 2. In another example, a dummy register, such as dummy register 300, is connected to all logic leaf connection nodes that are not otherwise connected to a logic leaf element. In doing so, the load distribution across the entire clock distribution network may be maintained.

Optionally, at step 920, a tuning element that has a chosen capacitance and granularity may be connected to a logic leaf connection node that is not connected to a register structure. In one example, tuning element 600 of FIG. 6, which has the same load as the desired load value of step 912, is connected to one of the multiple LL connection nodes 40 of LL elements 22, 26, 30, and/or 34 of clock distribution network 10 of FIG. 1, as shown in Tables 1, 2, and 3. In another example, a tuning element (e.g., tuning element 600 of FIG. 6) may be connected to a connection node 40 of a distribution segment of each of a final stage buffer circuits (e.g., buffer circuits 18a, 18b, 18c, and 18d), each tuning element having the same tuning load so that each buffer circuit is impacted with the same load characteristic.

In an alternative embodiment, the assigning of register structures to logic leaf connect nodes in a particular clock distribution network may include the generation of a schematic representation of the clock distribution network having proper placement of register structures in parallel with the generation of a physical skeleton design for the integrated circuit. In one example, the clock distribution network schematic representation may be synthesized utilizing known rules to limit and/or balance circuit loading and net length with desired clock latency specifications for a particular IC design. During schematic generation dummy registers placed in locations in the ideal clock distribution network may be replaced with registers having logic elements of the logic design, and vice versa, so long as the load at each logic leaf connection node remains the same across the network. Timing verification may be implemented on the schematic representation of the clock distribution network. If the network schematic fails timing verification, the process may repeat at step 912. Upon completion of clock distribution network schematic generation and generation of a physical IC skeleton, the physical design of the IC may take place with the positioning of each logic leaf element as set forth in the schematic representation (e.g., placement of register structures, tie off of unused register bits and/or reserve bits, placement of combinational logic, routing of the logic). In one aspect, the clock distribution routing may be fixed early in the process requiring no global routing of the clock tree at the time of IC physical design.

In another example, an integrated clock distribution network may be analyzed to determine timing factors. If tuning is required, one or more tuning elements that were placed in the clock distribution network, may be adjusted to add or subtract capacitance from select nodes of the network.

A logic synthesis process, such as method 900, may optionally include a macro function, such as memory array, that impacts one or more distribution levels of the clock distribution network. Therefore, method 900 may optionally include a process for placing the macro function following a buffer circuit of one of the distribution levels such that the load characteristics of the distribution level that terminates in the buffer circuit are not impacted by the placement of the macro function. Additionally, the capacitance of the macro function is set to balance the load on the clock distribution network to which it is connected.

While in one embodiment, the clock tree routing is implemented on a preferred upper level metallurgy that is not truncated, in many cases, macro functions, such as memory arrays, may truncate many levels of metallurgy on the integrated circuit. Even if the macro function does not truncate the clock tree net, it may interfere with planned placement of one or more clock buffers in the tree. The clock tree structure, such as clock distribution network 10 of FIG. 1, allows truncation of any branch of the tree pursuant to the placement of a truncating macro function. Truncation of the branch is strictly controlled in the design process, with connection of the driver that is to drive the truncated branch preserved in order to keep the capacitive loading on the tree intact. Should the macro cell itself require connection to the clock tree, the macro cell is designed with a connect point that mimics the register connect point, such that the load on the tree is maintained.

It is to be noted that the aspects and embodiments described herein may be conveniently implemented using a machine (e.g., a general purpose computing device) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art.

Such software may be a computer program product that employs a machine-readable medium. A machine-readable medium may be any medium that is capable of storing and/or encoding a sequence of instructions for execution by a machine (e.g., a general purpose computing device) and that causes the machine to perform any one of the methodologies and/or embodiments described herein. Examples of a machine-readable medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory.

In one aspect, in contrast to prior art clock tree synthesis processes that result in both potential clock skew and early or late data arrival times as factors in meeting timing requirements, an exemplary clock distribution network, structure, and method provides a mechanism for removing clock tree skew that is related to both physical capacitance/resistance mismatches that are associated with different net topologies and mismatches in across chip parametric variations that result from random placement of ASIC clock driver cells that are not designed to minimize across chip parametric variations. As a result, timing uncertainty is reduced with regard to the data arrival early/late variability and, thus, a superior design for high frequency function is provided.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of integrating a clock distribution network and a logic design in an integrated circuit, the clock distribution network having a number of distribution levels from a clock source and a plurality of logic leaf connection nodes, each distribution level including at least one distribution segment, the method comprising:
   providing a logic design having a plurality of clocked logic elements;
   determining a desired load value for each of the plurality of logic leaf connection nodes;
   grouping one or more of said plurality of clocked logic elements together in a corresponding respective one of a plurality of register structures, each of said plurality of clocked logic elements being grouped in one of said plurality of register structures, each of said plurality of register structures having a load on said clock distribution network that is substantially the same as said desired load value;
   assigning each of said plurality of register structures to a corresponding respective one of said plurality of logic leaf connection nodes; and
   connecting a dummy register to a corresponding respective one of said plurality of logic leaf connection nodes that is not connected to one of said plurality of registers, said dummy register having a load on said clock distribution network that is substantially the same as said desired load value.

2. A method according to claim 1, further comprising connecting a tuning element to a corresponding respective one of said plurality of logic leaf connection nodes that is not connected to one of said plurality of register structures.

3. A method according to claim 2, further comprising:
   synthesizing the clock distribution network with the logic design;
   performing timing analysis on the synthesized clock distribution network and logic design;
   determining if an additional load is required; and
   adding capacitance to said clock distribution network using said tuning element in response to the additional load determination.

4. A method according to claim 1, further comprising:
   synthesizing the clock distribution network with the logic design.

5. A method according to claim 4, wherein said synthesizing the clock distribution network with the logic design comprises:
   building a schematic representation of the ideal clock distribution network with proper placement of registers on said plurality of logic leaf connection nodes; and
   generating a physical skeleton of the integrated circuit in parallel with said building a schematic representation.

6. A method according to claim 1, further comprising ensuring that all of said plurality of logic leaf connection nodes have a load that is substantially the same as said desired load value.

7. A method according to claim 1, wherein each of said at least one distribution segments in a given distribution level have substantially the same physical and electrical properties.

8. A method according to claim 1, wherein each of said plurality of logic leaf connection nodes is connected to the clock source by a path having substantially the same load characteristics.

9. A method according to claim 1, wherein said clock distribution network includes:
   a first distribution level including a first set of buffer circuits and a first set of distribution segments, each of said first plurality of distribution segments connecting said clock source to a corresponding respective one of said first set, each of said first plurality of distribution segments having substantially the same physical and electrical properties, each buffer circuit of said first set having substantially the same load;
   a second distribution level of clock fanout including a second set of buffer circuits and a second plurality of distribution segments, each of said second plurality of distribution segments connecting a buffer circuit of said first set to a buffer circuits of said second set, each buffer circuit of said first set being connected to an equal number of buffer circuits of said second set, each of said second plurality of distribution segments having substantially the same load, each buffer circuit of said second set having substantially the same load; and a logic leaf distribution level including a third plurality of distribution segments connecting a buffer circuit of said second set to a node of said plurality of logic leaf connection nodes, each buffer circuit of said second set being connected to an equal number of said plurality of logic leaf connection nodes, each of said third plurality of distribution segments having substantially the same physical and electrical properties.

10. A method according to claim 1, wherein said grouping one or more of said plurality of clocked logic elements includes:

auditing said logic design;

determining a preferred bit width for said plurality of register structures;

assigning each of said plurality of clocked logic elements to a corresponding respective one of said plurality of register structures such that the number of clocked logic elements assigned to each of said plurality of register structures is less than or equal to said preferred bit width; and assigning one or more dummy load elements and/or one or more reserve bits to any of said plurality of register structures having less than said desired load such that each of said plurality of register structures has said desired load.

11. A method according to claim 1, wherein said logic design includes a macro function that impacts one or more distribution levels of the clock distribution network, the method further comprising placing the macro function after a buffer circuit of one of said distribution levels such that the load characteristics of the distribution level terminating in said buffer circuit are not impacted by said placing.

12. A method according to claim 11, further comprising setting the capacitance of said macro function to balance load on said ideal clock distribution network.

13. A method of integrating a clock distribution network and a logic design in an integrated circuit, the clock distribution network having a number of distribution levels from a clock source and a plurality of logic leaf connection nodes, each distribution level including at least one distribution segment, the method comprising:

providing a logic design having a plurality of clocked logic elements;

determining a desired load value for each of the plurality of logic leaf connection nodes;

grouping one or more of said plurality of clocked logic elements together in a corresponding respective one of a plurality of register structures, each of said plurality of clocked logic elements being grouped in one of said plurality of register structures, each of said plurality of register structures having a load on said clock distribution network that is substantially the same as said desired load value;

connecting each of said plurality of register structures to a corresponding respective one of said plurality of logic leaf connection nodes;

connecting a dummy register to a corresponding respective one of said plurality of logic leaf connection nodes that is not connected to one of said plurality of registers, said dummy register having a load on said clock distribution network that is substantially the same as said desired load value;

connecting a tuning element to a corresponding respective one of said plurality of logic leaf connection nodes that is not connected to one of said plurality of register structures; and ensuring that all of said plurality of logic leaf connection nodes have a load that is substantially the same as said desired load value.

14. A method according to claim 13, wherein said clock distribution network includes:

a first distribution level including a first set of buffer circuits and a first set of distribution segments, each of said first plurality of distribution segments connecting said clock source to a corresponding respective one of said first set, each of said first plurality of distribution segments having substantially the same physical and electrical properties, each buffer circuit of said first set having substantially the same load;

a second distribution level of clock fanout including a second set of buffer circuits and a second plurality of distribution segments, each of said second plurality of distribution segments connecting a buffer circuit of said first set to a buffer circuits of said second set, each buffer circuit of said first set being connected to an equal number of buffer circuits of said second set, each of said second plurality of distribution segments having substantially the same load, each buffer circuit of said second set having substantially the same load; and a logic leaf distribution level including a third plurality of distribution segments connecting a buffer circuit of said second set to a node of said plurality of logic leaf connection nodes, each buffer circuit of said second set being connected to an equal number of said plurality of logic leaf connection nodes, each of said third plurality of distribution segments having substantially the same physical and electrical properties.

15. A method according to claim 13, wherein said grouping one or more of said plurality of clocked logic elements includes:

auditing said logic design;

determining a preferred bit width for said plurality of register structures;

assigning each of said plurality of clocked logic elements to a corresponding respective one of said plurality of register structures such that the number of clocked logic elements assigned to each of said plurality of register structures is less than or equal to said preferred bit width; and assigning one or more dummy load elements and/or one or more reserve bits to any of said plurality of register structures having less than said desired load such that each of said plurality of register structures has said desired load.

16. A method according to claim 13, wherein said logic design includes a macro function that impacts one or more distribution levels of the clock distribution network, the method further comprising placing the macro function after a buffer circuit of one of said distribution levels such that the load characteristics of the distribution level terminating in said buffer circuit are not impacted by said placing.

17. A method according to claim 16, further comprising setting the capacitance of said macro function to balance load on said ideal clock distribution network.

18. A computer readable medium containing computer executable instruction implementing a method of integrating a clock distribution network and a logic design in an integrated circuit, the clock distribution network having a number of distribution levels from a clock source and a plurality of logic leaf connection nodes, each distribution level including at least one distribution segment, the instructions comprising:

a set of instructions for receiving a logic design having a plurality of clocked logic elements;

a set of instructions for determining a desired load value for each of the plurality of logic Leaf connection nodes;

a set of instructions for grouping one or more of said plurality of clocked logic elements together in a corresponding respective one of a plurality of register structures, each of said plurality of clocked logic elements being grouped in one of said plurality of register structures, each of said plurality of register structures having a load on said clock distribution network that is substantially the same as said desired load value; and a set of instructions for connecting each of said plurality of register structures to a corresponding respective one of said plurality of logic leaf connection nodes, wherein said clock distribution network includes:

a first distribution level including a first set of buffer circuits and a first set of distribution segments, each of said first plurality of distribution segments connecting said clock source to a corresponding respective one of said first set, each of said first plurality of distribution segments having substantially the same physical and electrical properties, each buffer circuit of said first set having substantially the same load;

a second distribution level of clock fanout including a second set of buffer circuits and a second plurality of distribution segments, each of said second plurality of distribution segments connecting a buffer circuit of said first set to a buffer circuits of said second set, each buffer circuit of said first set being connected to an equal number of buffer circuits of said second set, each of said second plurality of distribution segments having substantially the same load, each buffer circuit of said second set having substantially the same load; and a logic leaf distribution level including a third plurality of distribution segments connecting a buffer circuit of said second set to a node of said plurality of logic leaf connection nodes, each buffer circuit of said second set being connected to an equal number of said plurality of logic leaf connection nodes, each of said third plurality of distribution segments having substantially the same physical and electrical properties.

* * * * *